United States Patent [19]

Jun

[11] Patent Number: 5,691,221
[45] Date of Patent: Nov. 25, 1997

[54] METHOD FOR MANUFACTURING SEMICONDUCTOR MEMORY DEVICE HAVING A STACKED CAPACITOR

[75] Inventor: Young Kwon Jun, Seoul, Rep. of Korea

[73] Assignee: LG Semicon Co., Ltd., Chungcheongbuk-do, Rep. of Korea

[21] Appl. No.: 698,145

[22] Filed: Aug. 15, 1996

[30] Foreign Application Priority Data

Sep. 5, 1995 [KR] Rep. of Korea ............... 28972/1995

[51] Int. Cl.⁶ .............................................. H01L 21/8242
[52] U.S. Cl. ......................... 437/52; 437/60; 437/919
[58] Field of Search ............................. 437/60, 52, 919

[56] References Cited

U.S. PATENT DOCUMENTS

| | | | |
|---|---|---|---|
| 4,742,018 | 5/1988 | Kimura et al. | 437/48 |
| 5,401,681 | 3/1995 | Dennison | 437/60 |
| 5,552,334 | 9/1996 | Tseng | 437/52 |
| 5,580,813 | 12/1996 | Hachisuka et al. | 437/52 |

*Primary Examiner*—Jey Tsai
*Attorney, Agent, or Firm*—Morgan, Lewis and Bockius, LLP

[57] ABSTRACT

A method for manufacturing a semiconductor memory device comprising the steps of forming a switching transistor including a gate insulating film, a gate electrode, and source and drain regions on a semiconductor substrate; forming a first insulating film on the substrate including the switching transistor; selectively etching the first insulating film to form a contact hole exposing the source or drain region of the switching transistor; forming a second insulating film on the substrate to fill the contact hole; patterning the second insulating film and the first insulating film to a predetermined pattern to thereby form a second insulating film pattern and a first insulating film pattern; selectively removing the first insulating film pattern; forming a conductive layer on an entire surface of the second insulating film pattern; selectively etching the conductive layer by using the second insulating film pattern as a mask, to thereby form a capacitor storage electrode; removing the second insulating film pattern; forming a capacitor dielectric film on an entire surface of the capacitor storage electrode; and forming a capacitor plate electrode on an entire surface of the capacitor dielectric film.

21 Claims, 10 Drawing Sheets

METHOD FOR MANUFACTURING SEMICONDUCTOR MEMORY DEVICE HAVING A STACKED CAPACITOR

BACKGROUND OF THE INVENTION

1. Field of the Invention

The present invention relates to a method for manufacturing a semiconductor memory device, and more particularly, to a method for forming a capacitor of a semiconductor memory device.

2. Discussion of the Related Art

High integration of semiconductor devices is a trend in the industry. As a result, many studies concerning three-dimensional capacitor structures have been conducted to increase storage capacitance of a capacitor in a memory cell as required by the high integration.

Among the suggested three-dimensional capacitor structures, a stacked capacitor is a structure suitable for mass production because of its easy manufacturing process. In addition to the increased storage capacitance, it has immunity to alpha particles.

Figure 1A:
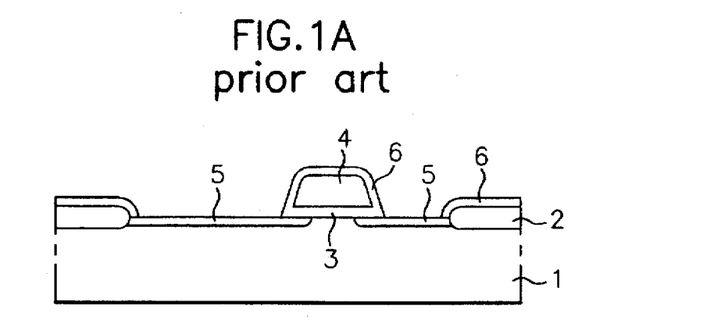
FIGS. 1A to 1G are cross-sectional views illustrating a conventional method for forming a capacitor of a semiconductor memory device.
Figure 1B:
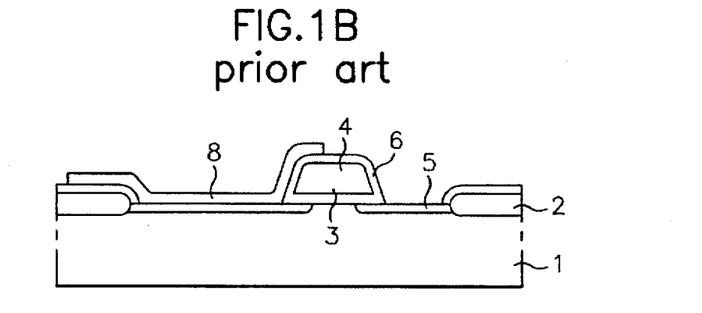
Figure 1C:
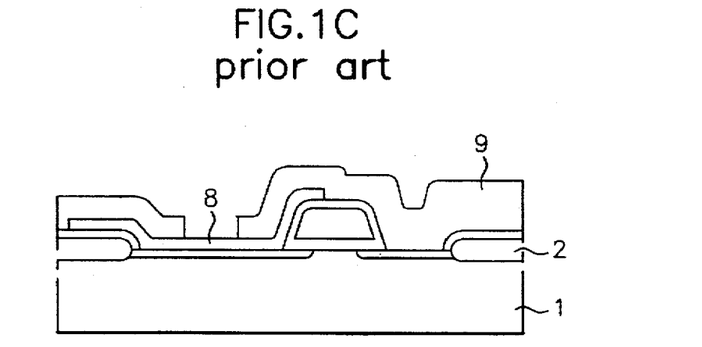
Figure 1D:
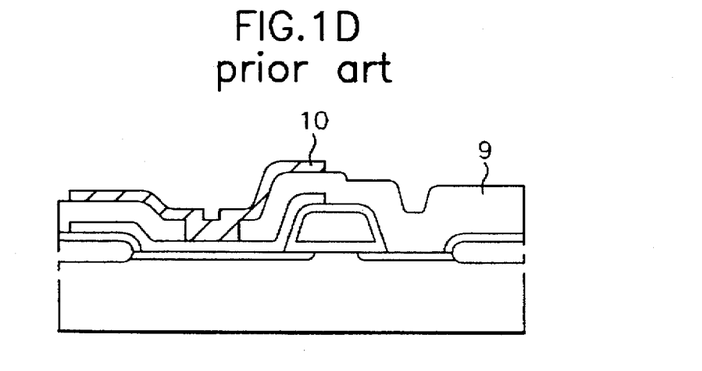
Figure 1E:
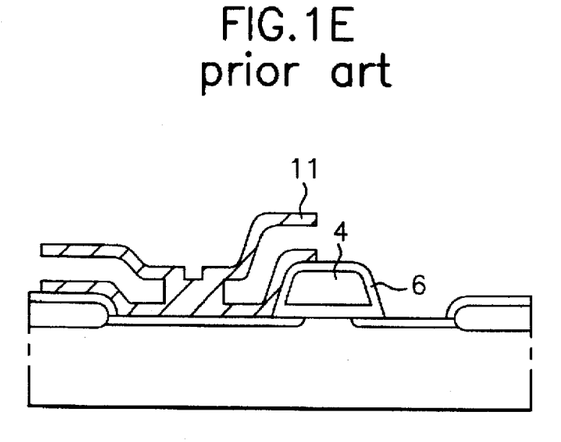
Figure 1F:
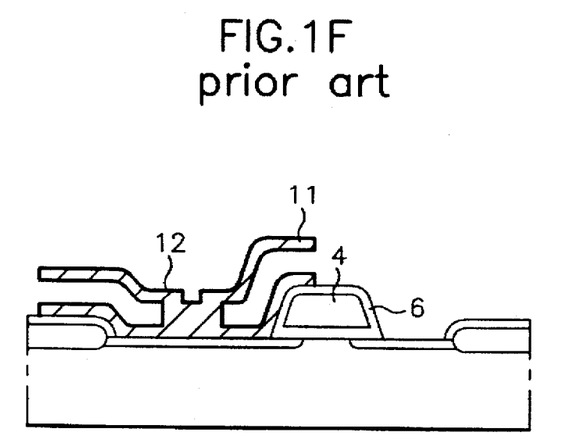
Figure 1G:
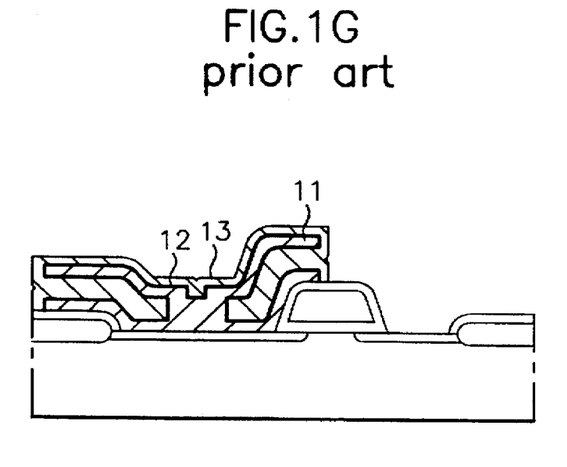

FIG. 1G shows a fin structure capacitor which is one of the stacked capacitor structures and which is disclosed in the U.S. Pat. No. 4,742,018. Its manufacturing method will now be described.

To begin with, as shown in FIG. 1A, by using a process for forming a general MOS transistor, a switching transistor is formed on a silicon substrate 1. The switching transistor includes a gate insulating film 3, a gate electrode 4, and source and drain regions 5. A first oxide film 6 is formed on the entire surface of the substrate including the switching transistor, and then etched selectively to form a contact hole exposing the source and drain regions 5.

As shown in FIG. 1B, a first conductive layer is formed on the entire surface of the substrate and patterned to a predetermined pattern, thereby forming a first storage electrode pattern 8 connected to the source or drain region 5 through the contact hole.

As shown in FIG. 1C, a second oxide film 9 is formed on the entire surface of the substrate and then etched selectively to form a contact hole exposing the first storage electrode pattern 8.

As shown in FIG. 1D, a second conductive layer is formed on the entire surface of the substrate and patterned to a predetermined pattern, thereby forming a second storage electrode pattern 10 connected to the first storage electrode pattern 8 through the contact hole.

As shown in FIG. 1E, the second oxide film is removed through a wet etching, thereby forming a capacitor storage electrode 11 consisting of the first storage electrode pattern 8 and the second storage electrode pattern 10.

As shown in FIG. 1F, a capacitor dielectric film 12 is formed on the entire surface of the storage electrode 11.

As shown in FIG. 1G, a third conductive layer is formed on the entire surface of the substrate and patterned to a predetermined pattern, thereby forming a capacitor plate electrode 13 on the entire surface of the dielectric film 12. As a result, a capacitor having a fin structure is completed.

The above conventional method for forming the stacked capacitor is complicated and unpractical. In order to form the storage electrode pattern of the capacitor, it requires two processes of depositing a conductive layer and three processes of forming a mask, respectively.

SUMMARY OF THE INVENTION

Accordingly, the present invention is directed to a method for manufacturing a semiconductor memory device that substantially obviates one or more of the problems due to limitations and disadvantages of the related art.

An object of the present invention is to provide a method for manufacturing a capacitor of a semiconductor memory device with a large storage capacitance and with a simplified process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as Well as the appended drawings.

To achieve these and other advantages and in accordance with the purpose of the present invention, as embodied and broadly described, the method for manufacturing a semiconductor memory device of the present invention includes the steps of forming a switching transistor on a semiconductor substrate, the switching transistor having source and drain regions; forming a first insulating film on the substrate including the switching transistor; selectively etching the first insulating film to form a contact hole exposing the source or drain region of the switching transistor; forming a second insulating film on the substrate to fill the contact hole; patterning the second insulating film and the first insulating film to form a second insulating film pattern and a first insulating film pattern; removing the first insulating film pattern; forming a conductive layer on an entire surface of the second insulating film pattern; selectively removing the conductive layer by using the second insulating film pattern as a mask, to thereby form a capacitor storage electrode; removing the second insulating film pattern; forming a capacitor dielectric film on an entire surface of the capacitor storage electrode; and forming a capacitor plate electrode on entire surface of the capacitor dielectric film.

In another aspect, the method for manufacturing a semiconductor memory device of the present invention includes the steps of forming a switching transistor consisting of a gate insulating film, a gate electrode and source and drain regions on a semiconductor substrate; forming a first insulating film on the entire surface of the substrate on which the switching transistor is formed; selectively etching the first insulating film to form a contact hole exposing the source or drain region of the switching transistor; forming a second insulating film on the entire surface of the substrate so as to fill the contact hole; patterning the second insulating film and the first insulating film to a predetermined pattern, to thereby form a first insulating film pattern and a second insulating film pattern; selectively removing the first insulating film pattern; forming a first conductive layer on the entire surface of the second insulating film pattern; selectively etching the first conductive layer by using the second insulating film pattern as a mask, to thereby form a storage electrode of a capacitor; removing the second insulating film pattern; forming a dielectric film of the capacitor on the entire surface of the storage electrode of the capacitor; and forming a plate electrode of the capacitor on the entire surface of the dielectric film of the capacitor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incor-

3 porated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

FIGS. 2A–2M illustrate a method for manufacturing a semiconductor memory device according to a first embodiment of the present invention.

Figure 2A:
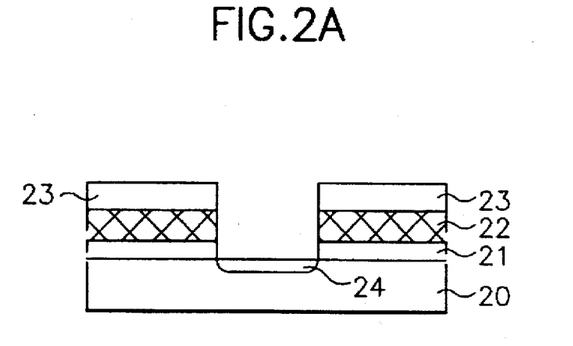
FIGS. 2A to 2M, 2K', 2L' and 2M' are cross-sectional views illustrating a method for forming a capacitor of a semiconductor memory device, according to a first and a second embodiment of the present invention.

To begin with, as shown in FIG. 2A, a gate insulating film 21, a first conductive layer 22 (for forming a gate electrode), and a gate cap oxide film 23 are formed sequentially on a semiconductor substrate 20. After patterning these stacked films to a gate electrode pattern, an impurity ion of a conductive type opposite to that of the substrate is implanted and heat-treated, thereby forming source and drain regions 24. It is preferred to form the first conductive layer 22 (i.e., the gate electrode) by depositing polysilicon on the gate insulating film 21.

Figure 2B:
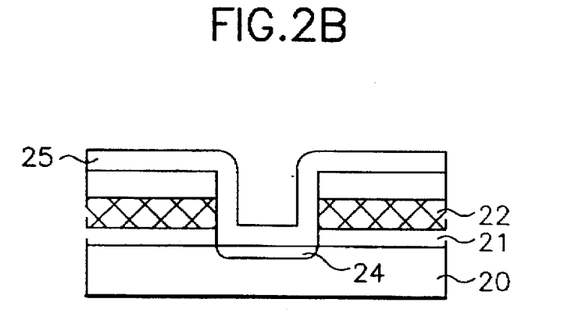

As shown in FIG. 2B, an insulating film 25 (e.g., an oxide film), is formed on the entire surface of the substrate including the gate pattern consisting of the gate insulating film 21, the gate electrode 22 and the gate cap oxide film 23.

Figure 2C:
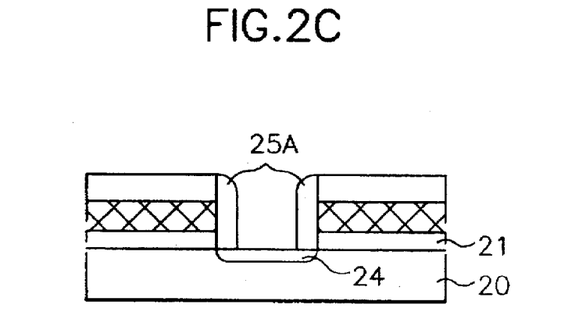

As shown in FIG. 2C, the oxide film 25 is etched back to form an insulating film sidewall 25A on the side of the gate pattern. At this time, the source or drain regions 24 formed in the substrate are exposed partially.

Figure 2D:
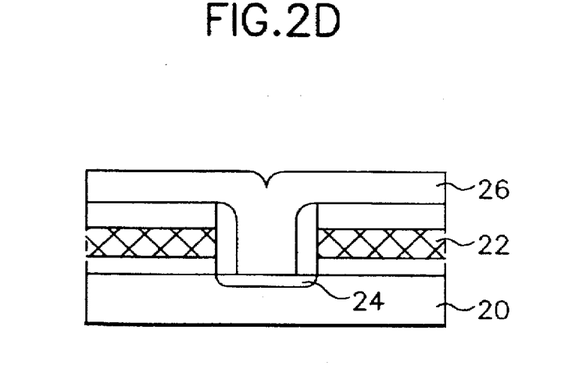

As shown in FIG. 2D, a first insulating film 26 is formed on the entire surface of the substrate. As a result, the partially exposed source or drain regions 24 are covered with the first insulating film 26. The first insulating film 26 is formed of a material having an etch selectivity to the gate cap oxide film 23 or the insulating film sidewall 25A. The preferred material for the first insulating film 26 includes silicon nitride or polyimide.

Figure 2E:
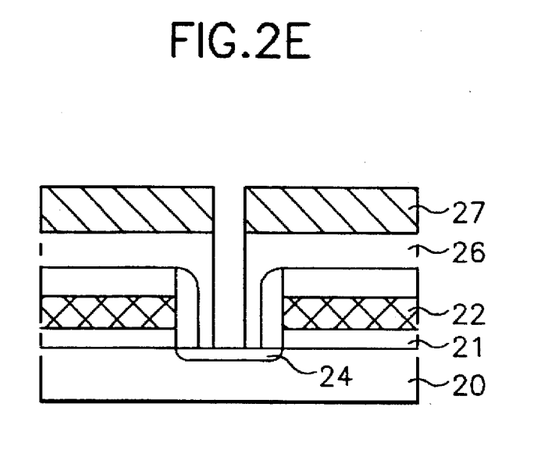

As shown in FIG. 2E, through lithography and etching process using a predetermined photoresist film pattern 27, the first insulating film 26 is selectively etched to form a contact hole partially exposing the source or drain regions 24.

Figure 2F:
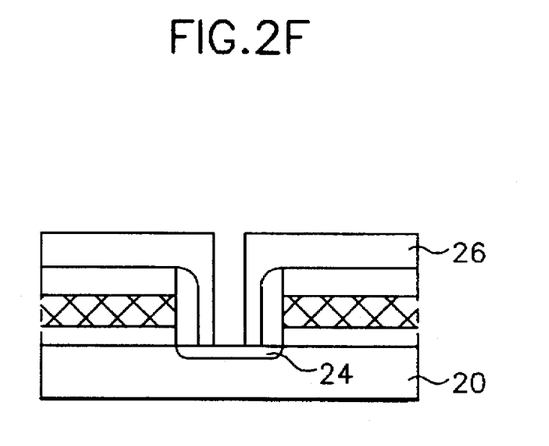

As shown in FIG. 2F, the photoresist film pattern 27 is then removed.

Figure 2G:
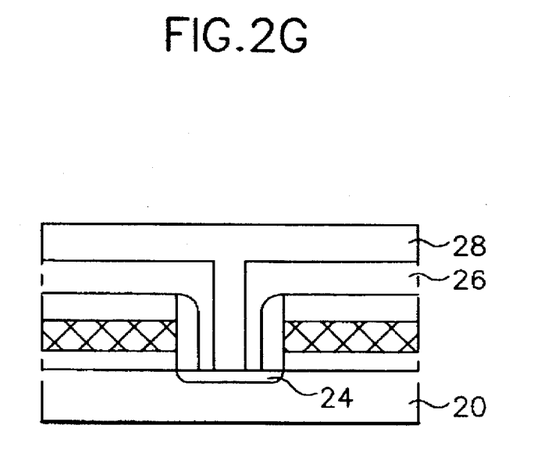

As shown in FIG. 2G, a second insulating film 28 is formed on the entire surface of the substrate to fill the contact hole. The second insulating film 28 is formed of a material having an etch selectivity to the first insulating film 26. If the first insulating film 26 is a polyimide film, it is preferred that the second insulating film 28 is formed of a silicon nitride film. If the first insulating film 26 is a silicon nitride film, it is preferred that the second insulating film 28 is formed of a polyimide film.

4

Figure 2H:
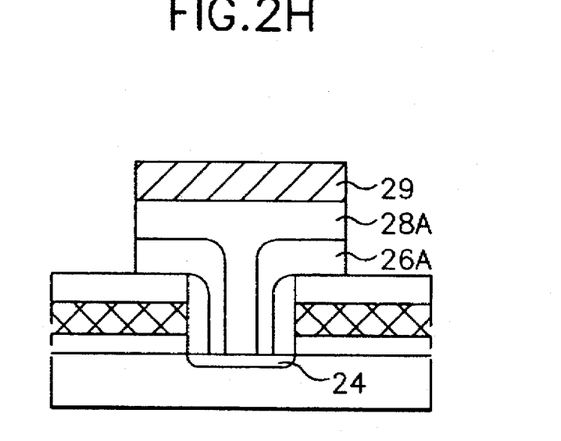

As shown in FIG. 2H, through lithography and etching process using a predetermined photoresist film pattern 29, the second insulating film 28 and the first insulating film 26 are selectively etched to form a second insulating film pattern 28A and a first insulating film pattern 26A.

Figure 2I:
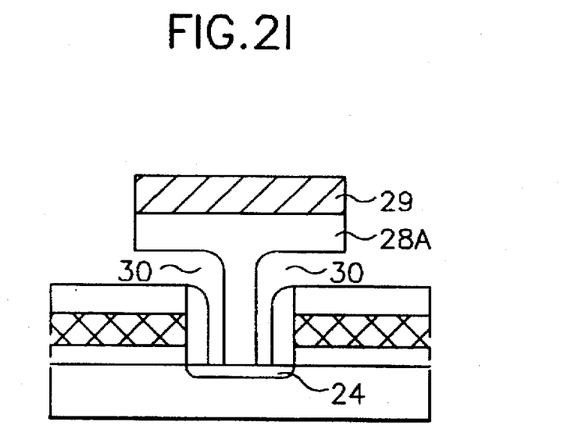

As shown in FIG. 2I, the first insulating fill pattern 26A is selectively removed to form a space region 30. If the first insulating fill pattern 26A is formed of a silicon nitride film, it is removed using a wet etchant including a $H_3PO_4$. If the first insulating film pattern 26A is formed of a polyimide fill, it is removed using a wet etchant including $H_2O_2$.

Figure 2J:
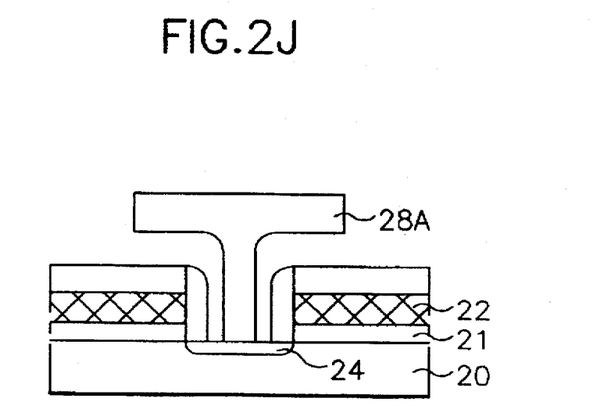

As shown in FIG. 2J, the photoresist film pattern 29 is then removed.

Figure 2K:
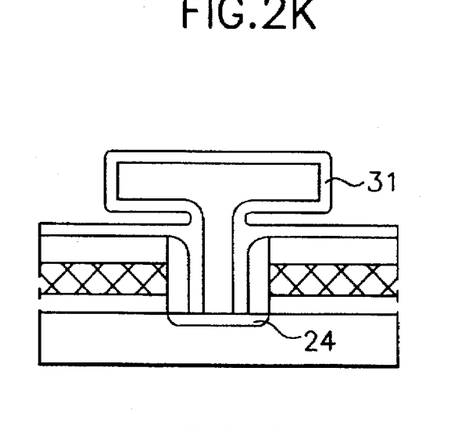

As shown in FIG. 2K, a second conductive layer 31 is formed on the entire surface of the second insulating fill pattern 28A. At this time, if the height of the space region 30 between the gate and the second insulating film pattern 28A is "h" and the average thickness of the second conductive layer 31 is "t", the second conductive layer 31 is formed to a thickness of t<h/2 so that the space region 30 is not completely filled with the second conductive layer 31. It is preferred to form the second conductive layer 31 by depositing an amorphous silicon or a polysilicon through a chemical vapor deposition (CVD) method using a Si-contained gas such as a $SiH_4$ or a $SiH_4Cl_2$. In addition, an in-situ doped silicon film may be formed by introducing an impurity gas including a $PH_3$.

Figure 2L:
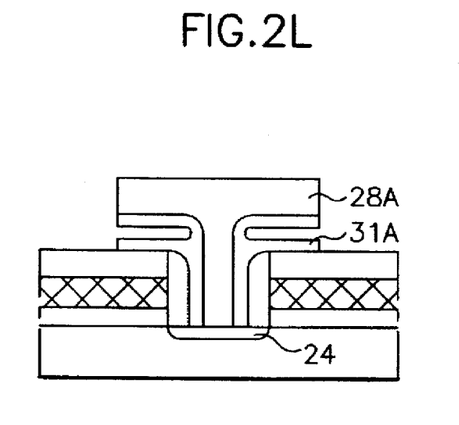

As shown in FIG. 2L, using the second insulating film pattern 28A as a mask, the second conductive layer 31 is selectively etched to form a storage electrode 31A of a capacitor.

Figure 2M:
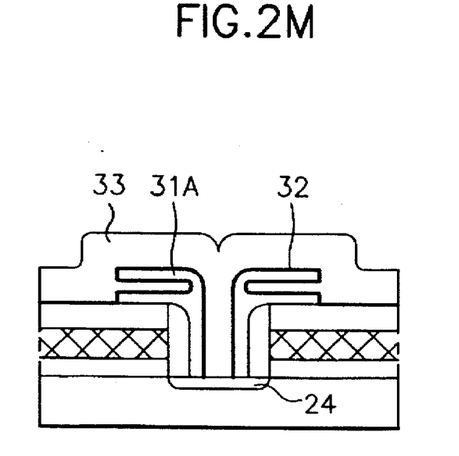

As shown in FIG. 2M, after removing the second insulating film pattern 28A, a dielectric film 32 of the capacitor is formed on the entire surface of the capacitor storage electrode 31A and the entire surface of the substrate exposed due to the removal of the second insulating film pattern 28A. A third conductive layer is formed on the entire surface and patterned to a predetermined pattern, thereby forming a plate electrode 33 of the capacitor. As a result, a capacitor having a fin structure is completed.

A second embodiment of the present invention will now be described.

After the processes of FIGS. 2A to 2J of the first embodiment, the second insulating film pattern 28A is formed. As shown in FIG. 2K', a second conductive layer 31 is then formed on the entire surface of the second insulating film pattern 28A. At this time, if the height of the space region 30 between the gate and the second insulating film pattern 28A is "h" and the average thickness of the second conductive layer 31 is "t", the second conductive layer 31 is formed to a thickness of t≧h/2 so that the space region 30 is completely filled with the second conductive layer 31. It is preferred to form the second conductive layer 31 by depositing an amorphous silicon or a polysilicon through a CVD method using a Si-contained gas such as a $SiH_4$ or a $SiH_2Cl_2$. In addition, an in-situ doped silicon film may be formed by introducing an impurity gas of a $PH_3$.

Then, as shown in FIG. 2L', using the second insulating film pattern 28A as a mask, the second conductive layer 31 is etched back until the second insulating film pattern 28A is exposed. At this time, a sidewall of the second conductive layer 31 is formed along the edge of the upper part of the second insulating film pattern 28A, thereby forming a storage electrode 3 1B of a capacitor having an overall cylindrical shape.

As shown in FIG. 2M', after removing the second insulating film pattern 28A, a dielectric film 32 of the capacitor is formed on the entire surface of the capacitor storage electrode 31B and the entire surface of the substrate exposed due to the removal of the second insulating film pattern 28A. A third conductive layer is formed on the entire surface and patterned to a predetermined pattern, thereby forming a plate electrode 33 of the capacitor. As a result, a capacitor having a cylindrical structure is completed.

Therefore, according to the depositing thickness of the second conductive layer, a capacitor having a fin structure (as in the first embodiment) or a cylindrical structure (as in the second embodiment) can be formed.

Hereinafter, a third and a fourth embodiments of the present invention will be described with reference to FIGS. 3A to 3M'.

Figure 3A:
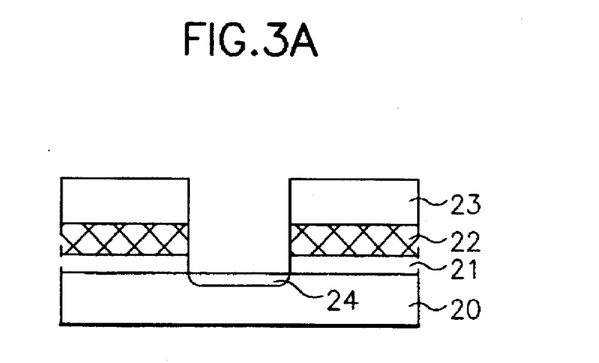
FIGS. 3A to 3M, 3K', 2L' and 3M' are cross-sectional views illustrating a method for forming a capacitor of a semiconductor memory device, according to a third and a fourth embodiment of the present invention.

The third embodiment proceeds as the following. To begin with, as shown in FIG. 3A, a gate insulating film 21, a first conductive layer 22 (for forming a gate electrode), and a gate cap oxide film 23 are formed sequentially on a semiconductor substrate 20. After patterning these stacked films to a gate electrode pattern, an impurity ion of a conductive type opposite to that of the substrate is implanted and heat-treated, thereby forming source and drain regions 24. It is preferred to form the first conductive layer 22 (i.e., the gate electrode) by depositing polysilicon on the gate insulating film 21.

Figure 3B:
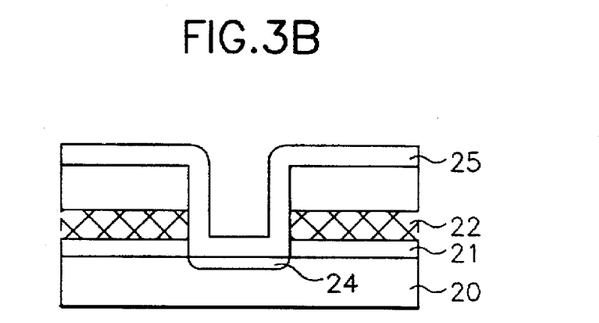

As shown in FIG. 3B, an insulating film 25 (e.g., an oxide film), is formed on the entire surface of the substrate including the gate pattern consisting of the gate insulating film 21, the gate electrode 22, and the gate cap oxide film 23.

Figure 3C:
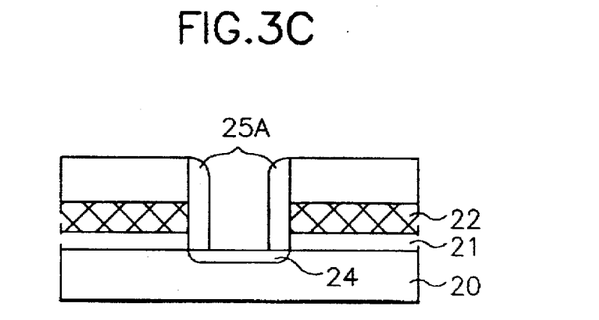

As shown in FIG. 3C, the oxide film 25 is etched back to form an insulating film sidewall 25A on the side of the gate pattern. At this time, source or drain regions 24 formed in the substrate are exposed partially.

Figure 3D:
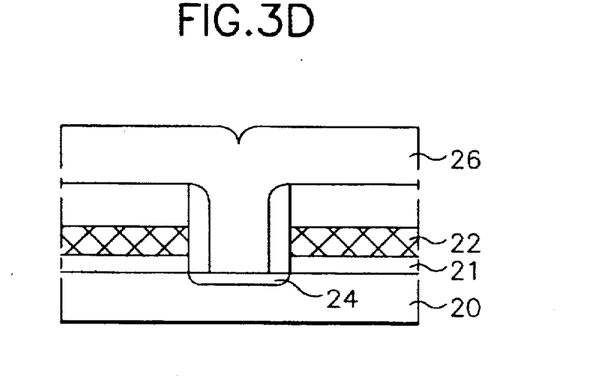

As shown in FIG. 3D, a first insulating film 26 is formed on the entire surface of the substrate. As a result, the partially exposed source or drain regions 24 are covered with the first insulating film 26. The first insulating film 26 is formed of a material having an etch selectivity to the gate cap oxide film 23 or the insulating film sidewall 25A. The preferred material for the first insulating film 26 includes silicon nitride or polyimide.

Figure 3E:
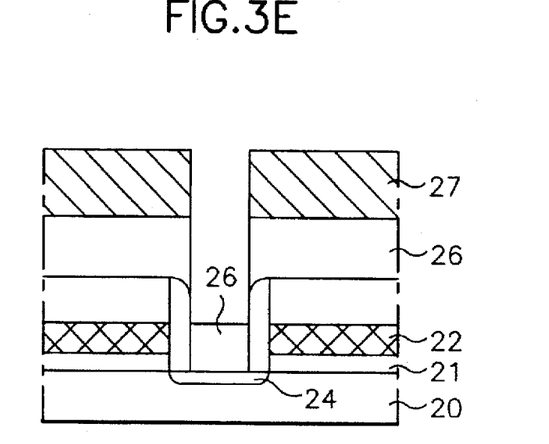

As shown in FIG. 3E, through lithography and etching process using a predetermined photoresist film pattern 27, the first insulating film 26 is selectively etched. At this time, the etching is performed so that the insulating film sidewall 25A is exposed while the first insulating film 26 is left to a predetermined thickness on the substrate between the gates. As a result, the source and drain regions 24 are not exposed.

Figure 3F:
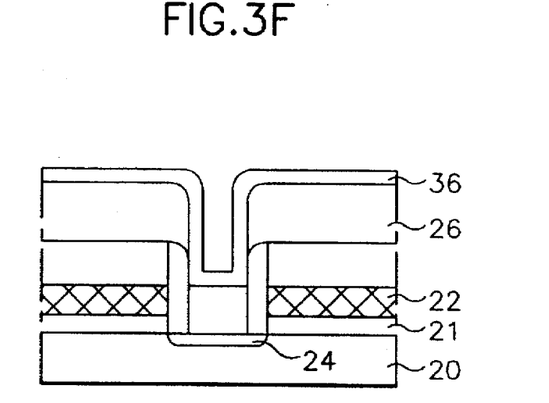
Figure 3G:
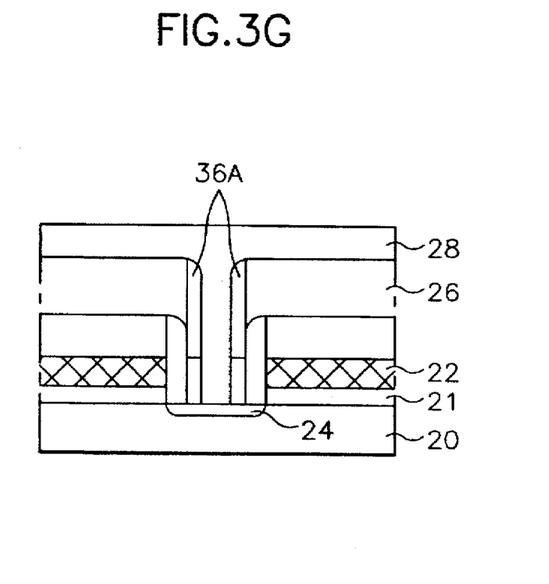

As shown in FIG. 3F, after removing the photoresist film pattern 27, an insulating film 36 consisting of the same material as the first insulating film 26 is formed on the entire surface of the first insulating film 26. Then, the insulating film 36 and the first insulating film 26 are etched back, thereby simultaneously forming an insulating film sidewall 36A and a contact hole exposing the source or drain regions 24, as shown in FIG. 3G. Then, a second insulating film 28 is formed on the entire surface of the substrate to fill the contact hole. The second insulating film 28 is formed of a material having an etch selectivity to the first insulating film 26. For example, if the first insulating film 26 is a silicon nitride film, it is preferred that the second insulating film 28 is formed of a polyimide film. If the first insulating film is a polyimide film, the second insulating film should be formed of a silicon nitride film.

Figure 3H:
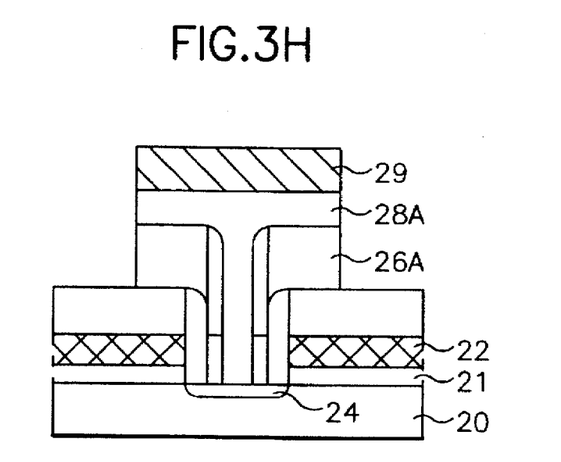

As shown in FIG. 3H, through lithography and etching process using a predetermined photoresist film pattern 29, the second insulating film 28 and the first insulating film 26 are selectively etched to form a second insulating film pattern 28A and a first insulating film pattern 26A.

Figure 3I:
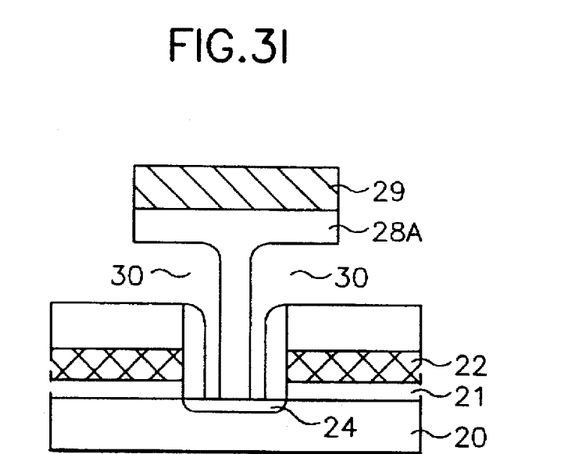

As shown in FIG. 3I, the first insulating film pattern 26A and the insulating film sidewall 36A are selectively removed to form a space region 30. If the first insulating film pattern 26A and the insulating film sidewall 36A are formed of silicon nitride films, they are removed using a wet etchant including a $H_8PO_4$. If the first insulating film pattern 26A and the insulating film sidewall 36A are formed of polyimide films, they are removed using a wet etchant including $H_2O_2$.

Figure 3J:
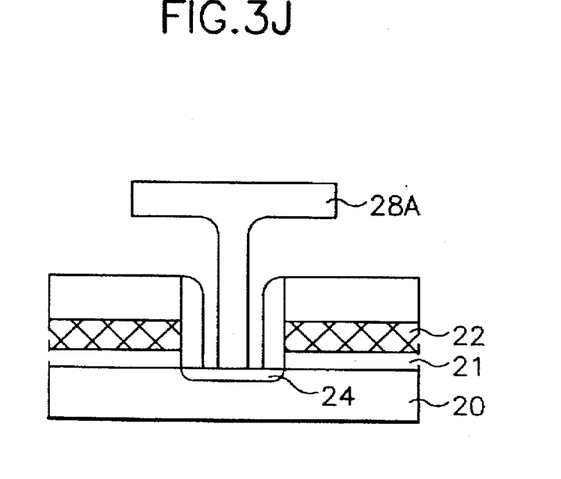

As shown in FIG. 3J, the photoresist film pattern 29 is then removed.

As shown in FIG. 3J, a second conductive layer 31 is formed on the entire surface of the second insulating film pattern 28A. At this time, if the height of the space region 30 between the gate and the second insulating film pattern 28A is "h" and the average thickness of the second conductive layer 31 is "t", the second conductive layer 31 is formed to a thickness of t<h/2 so that the space region 30 is not completely filled with the second conductive layer 31. It is preferred to form the second conductive layer 31 by depositing an amorphous silicon or a polysilicon through a CVD method using a Si-contained gas such as a $SiH_4$ or a $SiH_2Cl_2$. In addition, an in-situ doped silicon film may be formed by introducing an impurity gas of a $PH_3$.

Figure 3K:
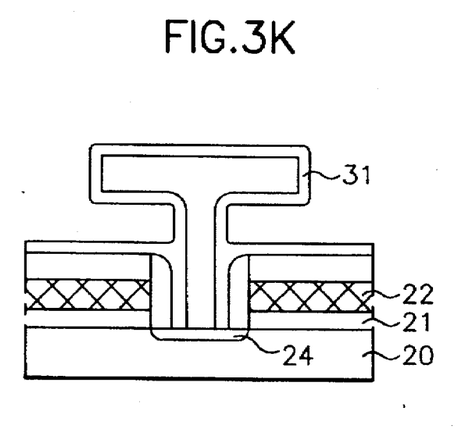
Figure 3L:
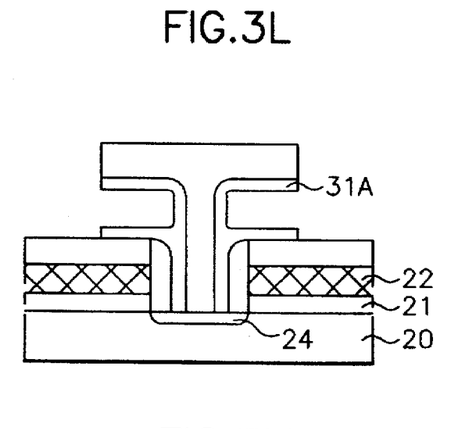

As shown in FIG. 3L, using the second insulating film pattern 28A as a mask, the second conductive layer 31 is selectively etched to form a storage electrode 31A of a capacitor.

Figure 3M:
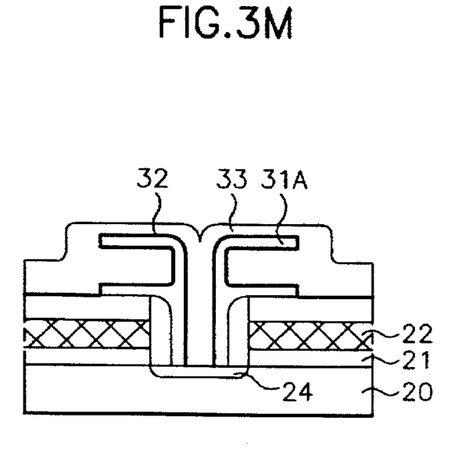

As shown in FIG. 3M, after removing the second insulating film pattern 28A, a dielectric film 32 for the capacitor is formed on the entire surface of the capacitor storage electrode 31A and the exposed surface of the substrate due to the removal of the second insulating film pattern 28A. A third conductive layer is formed on the entire surface and pattern to a predetermined pattern, thereby forming a plate electrode 33 of the capacitor. As a result, a capacitor having a fin structure is completed.

A fourth embodiment of the present invention will now be described.

After the processes of FIGS. 3A to 3J of the third embodiment, the second insulating film pattern 28A is formed. As shown in FIG. 3K', a second conductive layer 31 is then formed on the entire surface of the second insulating film pattern 28A. At this time, if the height of the space region 30 between the gate and the second insulating film pattern 28A is "h" and the average thickness of the second conductive layer 31 is "t", the second conductive layer 31 is formed to a thickness of t≧h/2 so that the space region 30 is completely filled with the second conductive layer 31. It is preferred to form the second conductive layer 31 by depositing an amorphous silicon or a polysilicon through a CVD method using a Si-contained gas such as a $SiH_4$ or a $SiH_2CL_2$. In addition, an in-situ doped silicon film may be formed by introducing an impurity gas of a $PH_3$.

Then, as shown in FIG. 3L', using the second insulating film pattern 28A as a mask, the second conductive layer 31 is etched back until the second insulating film pattern 28A is exposed. At this time, a sidewall of the second conductive layer 31 is formed along the edge of the upper part of the second insulating film pattern 28A, thereby forming a storage electrode 3 1B of a capacitor having an overall cylindrical shape.

As shown in FIG. 3M', after removing the second insulating film pattern 28A, a dielectric film 32 of the capacitor is formed on the entire surface of the capacitor storage electrode 31B and the exposed surface of the substrate due to the removal of the second insulating film pattern 28A. A third conductive layer is formed on the entire surface and patterned to a predetermined pattern, thereby forming a plate electrode 33 of the capacitor. As a result, a capacitor having a cylindrical structure is completed.

Therefore, according to the depositing thickness of the second conductive layer, a capacitor having a fin structure (as in the third embodiment) or a cylindrical structure (as in the fourth embodiment) can be formed.

The present invention has the following advantages. First, the fabrication process is simple and it is effective for high integration. A capacitor with a fin structure or a cylindrical structure can be easily formed by a one-time deposition of a conductive layer in the space region formed by selectively removing a temporary film (i.e., the first insulating film).

Second, the conductive layer for forming a capacitor electrode is etched not by a lithography and etching process, but by an etching process (etch-back) using a mask film pattern (second insulating film pattern). This improves the processing ability.

Third, according to the relative difference of the height of the space region and the depositing thickness of the conductive layer, a capacitor with a fin or cylindrical structure can be formed with ease.

Fourth, the shape of the conductive layer (fin or cylindrical shape) is formed simultaneously with the deposition. This assures the reliability of the process.

It will be apparent to those skilled in the art that various modifications and variations can be made in the method for manufacturing a semiconductor memory device of the present invention without departing from the spirit or scope of the invention. Thus, it is intended that the present invention cover the modifications and variations of this invention provided they come within the scope of the appended claims and their equivalents.

What is claimed is:

1. A method for manufacturing a semiconductor memory device, comprising the steps of:

forming a switching transistor including a gate insulating film, a gate electrode, and source and drain regions on a semiconductor substrate;

forming a first insulating film on the substrate including the switching transistor;

selectively etching the first insulating film to form a contact hole exposing the source or drain region of the switching transistor;

forming a second insulating film on the substrate to fill the contact hole;

patterning the second insulating film and the first insulating film to a pattern to thereby form a second insulating film pattern and a first insulating film pattern;

selectively removing the first insulating film pattern;

forming a conductive layer on an entire surface of the second insulating film pattern;

selectively etching the conductive layer by using the second insulating film pattern as a mask, to thereby form a capacitor storage electrode;

removing the second insulating film pattern;

forming a capacitor dielectric film on an entire surface of the capacitor storage electrode; and forming a capacitor plate electrode on an entire surface of the capacitor dielectric film.

2. The method as claimed in claim 1, wherein the conductive layer is formed to a thickness of t, which is less than one half of a height(h) of a space region formed due to the selective removal of the first insulating film pattern (t<h/2), resulting in a capacitor storage electrode with a fin structure.

3. The method as claimed in claim 1, wherein the conductive layer is formed to a thickness of t, which is no less than one half of a height(h) of a space region formed due to the selective removal of the first insulating fill pattern(t≧h/2), resulting in a capacitor storage electrode with a cylindrical structure.

4. The method as claimed in claim 1, wherein the second insulating film includes a material having an etch selectivity to the first insulating film.

5. The method as claimed in claim 1, wherein the step of selectively etching the first insulating film to form a contact hole includes the steps of:

etching the first insulating film so that it is left to a thickness on the substrate;

forming a third insulating film with the same material as the first insulating film on the entire surface of the first insulating fill; and etching back the third insulating fill and the first insulating film, to thereby simultaneously form an insulating film sidewall and a contact hole exposing the source or drain region.

6. The method as claimed in claim 1, before the step of forming the first insulating film, further comprising the steps of:

forming a third insulating film on an entire surface of the substrate including the switching transistor; and etching back the third insulating film to form an insulating film sidewall on sides of the gate electrode.

7. The method as claimed in claim 6, wherein the first insulating film has an etch selectivity to the insulating film sidewall.

8. A method for manufacturing a semiconductor memory device, comprising the steps of:

forming a switching transistor on a semiconductor substrate, the switching transistor having source and drain regions;

forming a first insulating film on the substrate including the switching transistor;

selectively etching the first insulating film to form a contact hole exposing the source or drain region of the switching transistor;

forming a second insulating film on the substrate to fill the contact hole;

patterning the second insulating film and the first insulating film to form a second insulating film pattern and a first insulating film pattern;

removing the first insulating film pattern;

forming a conductive layer on an entire surface of the second insulating film pattern;

selectively removing the conductive layer by using the second insulating film pattern as a mask, to thereby form a capacitor storage electrode;

removing the second insulating film pattern;

forming a capacitor dielectric film on an entire surface of the capacitor storage electrode; and forming a capacitor plate electrode on an entire surface of the capacitor dielectric film.

9. The method as claimed in claim 8, wherein the conductive layer is formed to a thickness of t, which is less than one half of a height(h) of a space region formed due to the removal of the first insulating film pattern (t<h/2), resulting in a capacitor storage electrode with a fin structure.

10. The method as claimed in claim 8, wherein the conductive layer is formed to a thickness of t, which is no less than one half of a height(h) of a space region formed due to the removal of the first insulating film pattern(t≧h/2), resulting in a capacitor storage electrode with a cylindrical structure.

11. The method as claimed in claim 8, wherein the first insulating film includes a polyimide film and the second insulating film includes a silicon nitride film.

12. The method as claimed in claim 8, wherein the first insulating film includes a silicon nitride film and the second insulating film includes a polyimide film.

13. The method as claimed in claim 8, wherein the second insulating film has an etch selectivity to the first insulating film.

14. The method as claimed in claim 8, wherein the step of forming a switching transistor includes the steps of:

forming a gate insulating film on the substrate;
   depositing polysilicon on the gate insulating film to form a gate electrode;
   forming a gate cap oxide film on the gate electrode;
   patterning the gate insulating film, the gate electrode, and the gate cap oxide film; and
   implanting and heat-treating impurity ions to the substrate to form the source and drain regions.

15. The method as claimed in claim 8, wherein the step of selectively etching the first insulating film to form a contact hole includes the steps of:

forming a photoresist pattern on the first insulating film;
   performing lithography and etching to form a contact hole partially exposing the source or drain region; and
   removing the photoresist pattern.

16. The method as claimed in claim 8, wherein the step of removing the first insulating film pattern includes using a wet etchant including $H_3PO_4$, the first insulating film including a silicon nitride film, and a wet etchant including $H_2O_2$, the first insulating film including a polyimide film.

17. The method as claimed in claim 8, wherein the step of forming the conductive layer includes depositing an amorphous silicon or a polysilicon through a chemical vapor deposition method using a Si-contained gas comprising $SiH_4$ or a $SiH_2CL_2$.

18. The method as claimed in claim 8, wherein the step of forming the conductive layer includes forming an in-situ doped silicon film using an impurity gas including a $PH_3$.

19. The method as claimed in claim 8, wherein the step of selectively etching the first insulating film to form a contact hole includes the steps of:

etching the first insulating film so that it is left to a thickness on the substrate;
   forming a third insulating film with the same material as the first insulating film on the entire surface of the first insulating film; and
   etching back the third insulating film and the first insulating film, to thereby simultaneously form an insulating film sidewall and a contact hole exposing the source or drain region.

20. The method as claimed in claim 8, before the step of forming the first insulating film, further comprising the steps of:

forming a third insulating film on an entire surface of the substrate including the switching transistor; and
   etching back the third insulating film to form an insulating film sidewall on sides of the gate electrode.

21. The method as claimed in claim 8, wherein the first insulating film has an etch selectivity to the insulating film sidewall.

* * * * *

UNITED STATES PATENT AND TRADEMARK OFFICE
CERTIFICATE OF CORRECTION

PATENT NO. : 5,691,221
DATED : November 25, 1997
INVENTOR(S) : JUN

It is certified that error appears in the above-identified patent and that said Letters Patent is hereby corrected as shown below:

Column 8, Line 9, change "fill" to --film--.

Signed and Sealed this

Sixteenth Day of March, 1999

Attest:

Q. TODD DICKINSON

*Attesting Officer*     *Acting Commissioner of Patents and Trademarks*